(12) United States Patent
Horiuchi

(10) Patent No.: US 12,370,669 B2
(45) Date of Patent: Jul. 29, 2025

(54) INDUSTRIAL ROBOT

(71) Applicant: NIDEC INSTRUMENTS CORPORATION, Nagano (JP)

(72) Inventor: Ryota Horiuchi, Nagano (JP)

(73) Assignee: NIDEC INSTRUMENTS CORPORATION, Nagano (JP)

( * ) Notice: Subject to any disclaimer, the term of this patent is extended or adjusted under 35 U.S.C. 154(b) by 0 days.

(21) Appl. No.: 18/278,399

(22) PCT Filed: Feb. 16, 2022

(86) PCT No.: PCT/JP2022/006085
§ 371 (c)(1),
(2) Date: Aug. 22, 2023

(87) PCT Pub. No.: WO2022/181405
PCT Pub. Date: Sep. 1, 2022

(65) Prior Publication Data
US 2024/0131682 A1 Apr. 25, 2024
US 2024/0227158 A9 Jul. 11, 2024

(30) Foreign Application Priority Data
Feb. 26, 2021 (JP) .................. 2021-030385

(51) Int. Cl.
*B25J 5/00* (2006.01)
*B25J 9/00* (2006.01)

(52) U.S. Cl.
CPC ............... *B25J 5/00* (2013.01); *B25J 9/0009* (2013.01)

(58) Field of Classification Search
CPC ... B25J 5/00; B25J 9/0009; B25J 9/042; B25J 18/04; B25J 19/0075; H01L 21/67766; H01L 21/677
See application file for complete search history.

(56) References Cited

U.S. PATENT DOCUMENTS

| 10,916,459 B2 | 2/2021 | Namioka |
| 2013/0195598 A1 | 8/2013 | Furuichi |

(Continued)

FOREIGN PATENT DOCUMENTS

| JP | 2008028078 | 2/2008 |
| JP | 2017119325 | 7/2017 |

(Continued)

OTHER PUBLICATIONS

"International Search Report (Form PCT/ISA/210) of PCT/JP2022/006085", mailed on Apr. 5, 2022, with English translation thereof, pp. 1-4.

(Continued)

*Primary Examiner* — Victor L MacArthur
(74) *Attorney, Agent, or Firm* — JCIPRNET

(57) ABSTRACT

Provided is an industrial robot including a lifting mechanism which lifts and lowers an arm support member and a housing inside which the lifting mechanism is disposed, and an opening part for connecting the arm support member disposed outside the housing with the lifting mechanism is formed in a side face of the housing. In the industrial robot, even when dust generated inside the housing can be prevented from flowing out from the opening part, the cost can be reduced. In the industrial robot, the lifting mechanism which lifts and lowers the arm support member is disposed inside the housing. A side face of the housing is formed with the opening part for connecting the arm support member disposed outside the housing with the lifting mechanism disposed inside the housing, and the arm support member is fixed with the flat plate-shaped cover members and for closing the opening part.

7 Claims, 4 Drawing Sheets

(56) References Cited

U.S. PATENT DOCUMENTS

| | | | |
|---|---|---|---|
| 2013/0323002 A1 | 12/2013 | Furuichi et al. | |
| 2020/0368789 A1 | 11/2020 | Ishitani et al. | |
| 2022/0152814 A1* | 5/2022 | Markowski | B25J 9/123 |

FOREIGN PATENT DOCUMENTS

| | | |
|---|---|---|
| JP | 2017127956 | 7/2017 |
| JP | 2019123024 | 7/2019 |
| JP | 2020009818 | 1/2020 |
| JP | 2020024976 | 2/2020 |
| JP | 2020188230 | 11/2020 |
| TW | 202007619 | 2/2020 |
| WO | 2018105284 | 6/2018 |

OTHER PUBLICATIONS

"Search Report of Europe Counterpart Application", issued on May 28, 2024, p. 1-p. 8.

* cited by examiner

INDUSTRIAL ROBOT

CROSS-REFERENCE TO RELATED APPLICATION

This application is a 371 application of the international PCT application serial no. PCT/JP2022/006085, filed on Feb. 16, 2022, which claims the priority benefits of Japan application no. 2021-030385, filed on Feb. 26, 2021. The entirety of each of the above-mentioned patent applications is hereby incorporated by reference herein and made a part of this specification.

TECHNICAL FIELD

The present invention relates to an industrial robot structured to transfer an object to be transferred such as a semiconductor wafer.

BACKGROUND ART

Conventionally, a transfer robot (substrate transfer device) has been known which transfers a semiconductor wafer or the like under a clean environment such as an inside of a clean room (see, for example, Patent Literature 1). The transfer robot described in Patent Literature 1 includes an arm support member which supports a hand and an arm, and a support column which supports the arm support member. The arm support member is capable of being lifted and lowered along the support column. An inside of the support column is arranged with a linear guide mechanism for lifting and lowering the arm support member. A side face of the support column is formed with an opening part for connecting the arm support member disposed outside the support column with the linear guide mechanism disposed inside the support column.

In the transfer robot described in Patent Literature 1, the opening part of the side face of the support column is formed in a range that the arm support member is lifted and lowered. In the transfer robot, in order to prevent dust generated from the linear guide mechanism and the like in the inside of the support column from flowing out into the outside of the support column through the opening part of the support column, the opening part of the support column is covered by a seal belt. The seal belt is disposed inside the support column. The inside of the support column is arranged with rollers (pulley) for guiding the seal belt.

CITATION LIST

Patent Literature

[Patent Literature 1] Japanese Patent Laid-Open No. 2008-28078

SUMMARY OF THE INVENTION

Problems to be Solved by the Invention

The transfer robot described in Patent Literature 1 includes a seal belt which closes the opening part of the support column. Therefore, as described above, the transfer robot is capable of preventing dust generated inside the support column from flowing out to the outside of the support column through the opening part of the support column. On the other hand, in the transfer robot, a seal belt and rollers are required for preventing dust generated inside the support column from flowing out to the outside of the support column through the opening part of the support column and thus, the number of components of the transfer robot increases and a cost of the transfer robot becomes high.

In view of the problem described above, the present invention provides an industrial robot including a lifting mechanism which lifts and lowers an arm support member and a housing in which the lifting mechanism is disposed inside the housing, and an opening part for connecting the arm support member disposed outside the housing with the lifting mechanism being formed in a side face of the housing and, in the industrial robot, even when dust generated inside the housing is capable of being prevented from flowing out from the opening part, the cost can be reduced.

Means to Solve the Problems

To solve the above-mentioned problem, the present invention provides an industrial robot including an arm, an arm support member which supports the arm, and a main body part which holds the arm support member so as to be capable of lifting and lowering the arm support member. The main body part includes a lifting mechanism for lifting and lowering the arm support member and a housing inside which the lifting mechanism is disposed, and the arm support member is disposed outside the housing. A side face of the housing is formed with an opening part for connecting the arm support member disposed outside the housing with the lifting mechanism disposed inside the housing, and the arm support member or a lifting member which is lifted and lowered together with the arm support member and is disposed inside the housing is fixed with a cover member in a flat plate shape for closing the opening part.

In the industrial robot in accordance with the present invention, the arm support member or a lifting member which is lifted and lowered together with the arm support member and is disposed inside the housing is fixed with a cover member in a flat plate shape for closing the opening part formed in a side face of the housing. Therefore, according to the present invention, the opening part in the side face of the housing is closed by using an inexpensive cover member in a flat plate shape and thereby, dust generated inside the housing is capable of being prevented from flowing out from the opening part to the outside of the housing. Accordingly, in the present invention, even when the dust generated inside the housing is capable of being prevented from flowing out from the opening part to the outside of the housing, a cost of the industrial robot can be reduced.

In the present invention, it is preferable that the cover member is fixed to the arm support member and is disposed outside the housing. According to this structure, an arrangement space of the cover member is not required to provide in an inside of the housing. Therefore, a degree of freedom of arrangement of various parts disposed inside the housing can be enhanced and, in addition, a size of the housing can be reduced.

In the present invention, it is preferable that the arm support member is fixed with a first cover member and a second cover member. The first cover member and the second cover member are as the cover member. The first cover member is for closing an upper side portion of the opening part, and the second cover member is for closing a lower side portion of the opening part. An upper end of the first cover member is disposed on a lower side with respect to an upper end of the main body part when the arm support member is moved to an upper limit position with respect to the housing, and a lower end of the second cover member is disposed on an upper side with respect to a lower end of the main body part when the arm support member is moved to a lower limit position with respect to the housing. According to this structure, even when the first cover member and the second cover member which are lifted and lowered together with the arm support member are fixed to the arm support member, a size of the industrial robot can be prevented from increasing in the upper and lower direction.

Effects of the Invention

As described above, according to the present invention, in the industrial robot including a lifting mechanism which lifts and lowers an arm support member and a housing inside which the lifting mechanism is disposed, and an opening part for connecting the arm support member disposed outside the housing with the lifting mechanism being formed in a side face of the housing, even when dust generated inside the housing is capable of being prevented from flowing out from the opening part, a cost of the industrial robot can be reduced.

DESCRIPTION OF EMBODIMENTS

An embodiment of the present invention will be described below with reference to the accompanying drawings.
(Structure of Industrial Robot)

Figure 1:
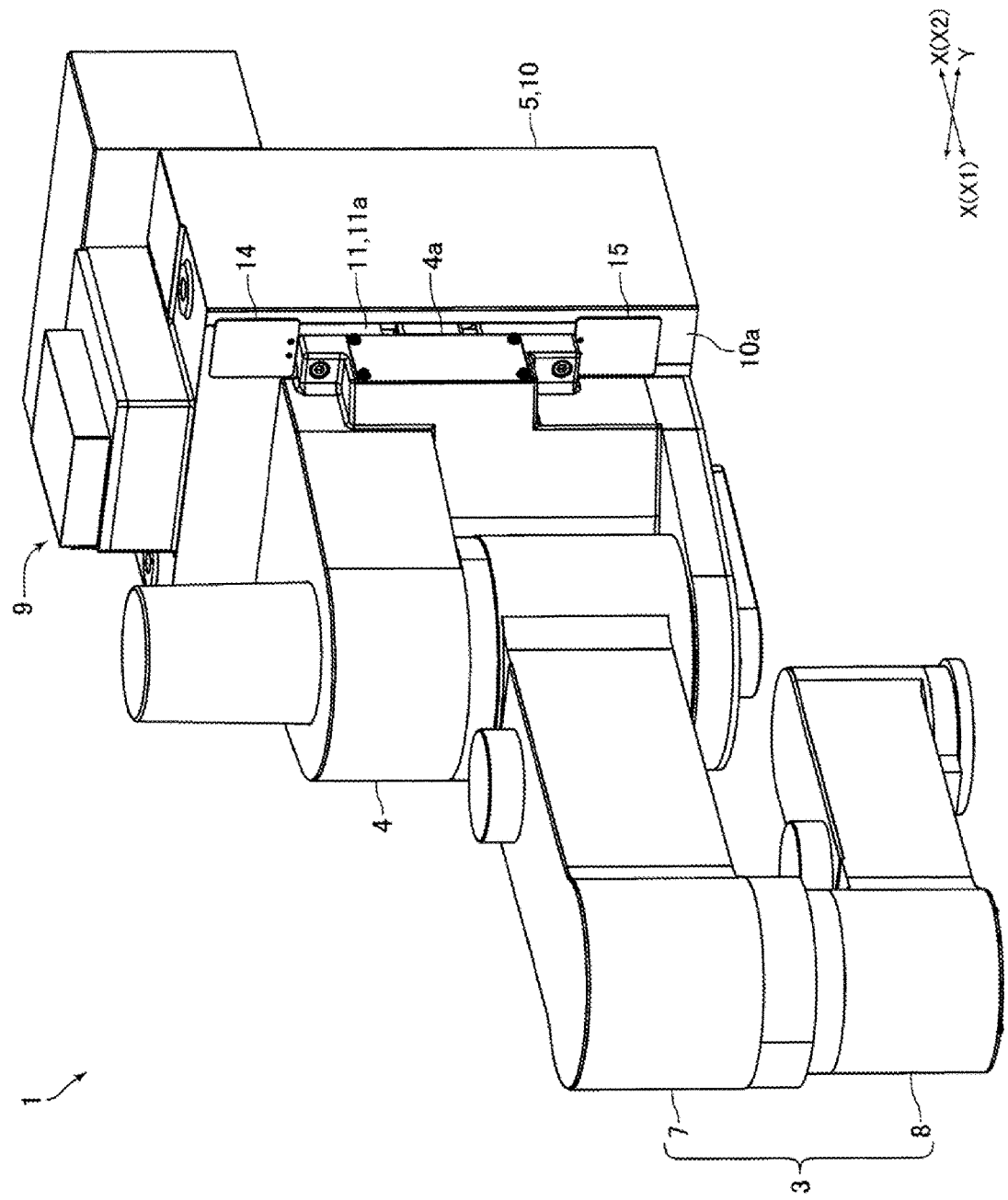
FIG. 1 is a perspective view showing an industrial robot in accordance with an embodiment of the present invention.
Figure 2:
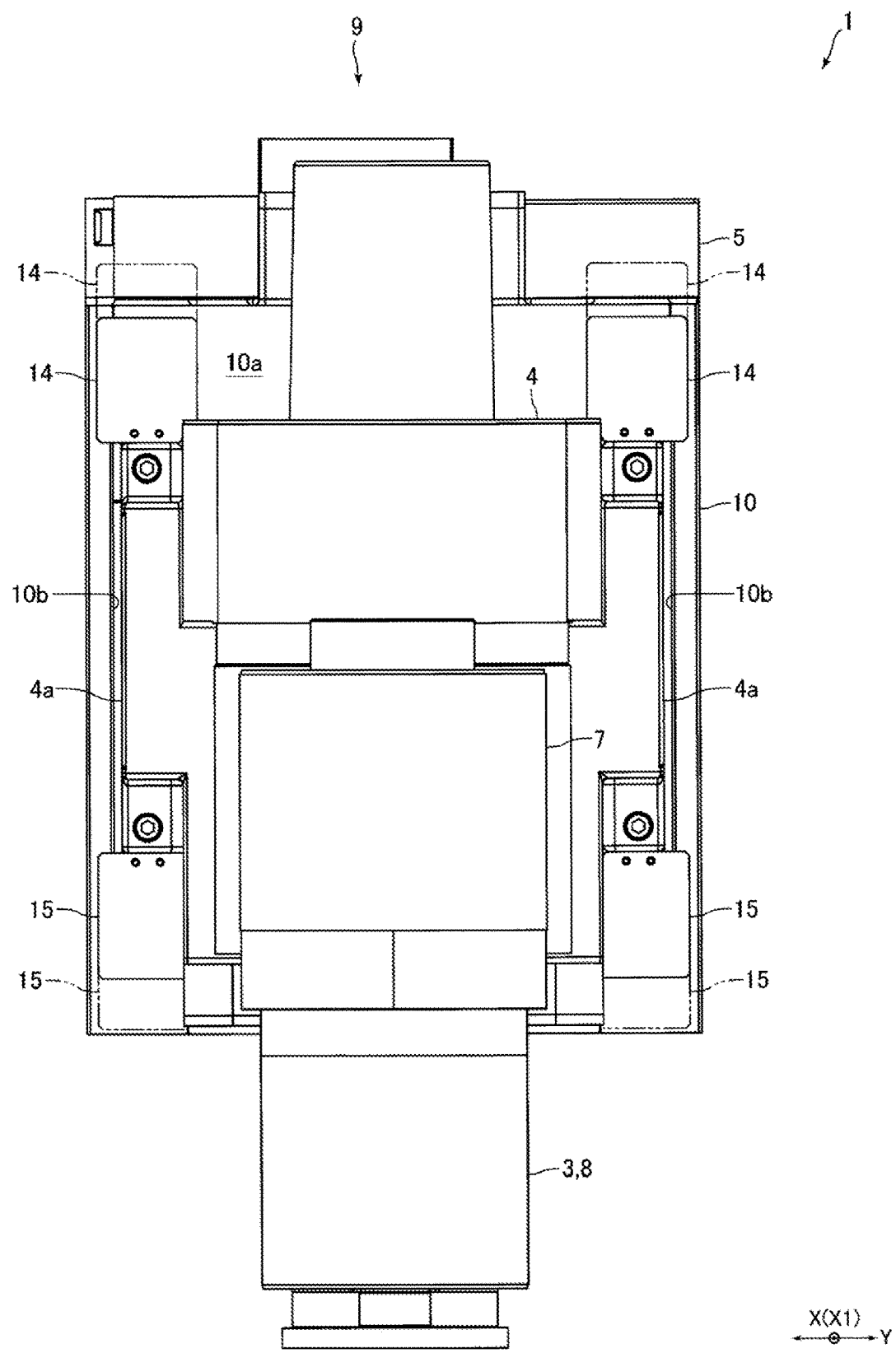
FIG. 2 is a front view showing the industrial robot in FIG. 1.
Figure 3:
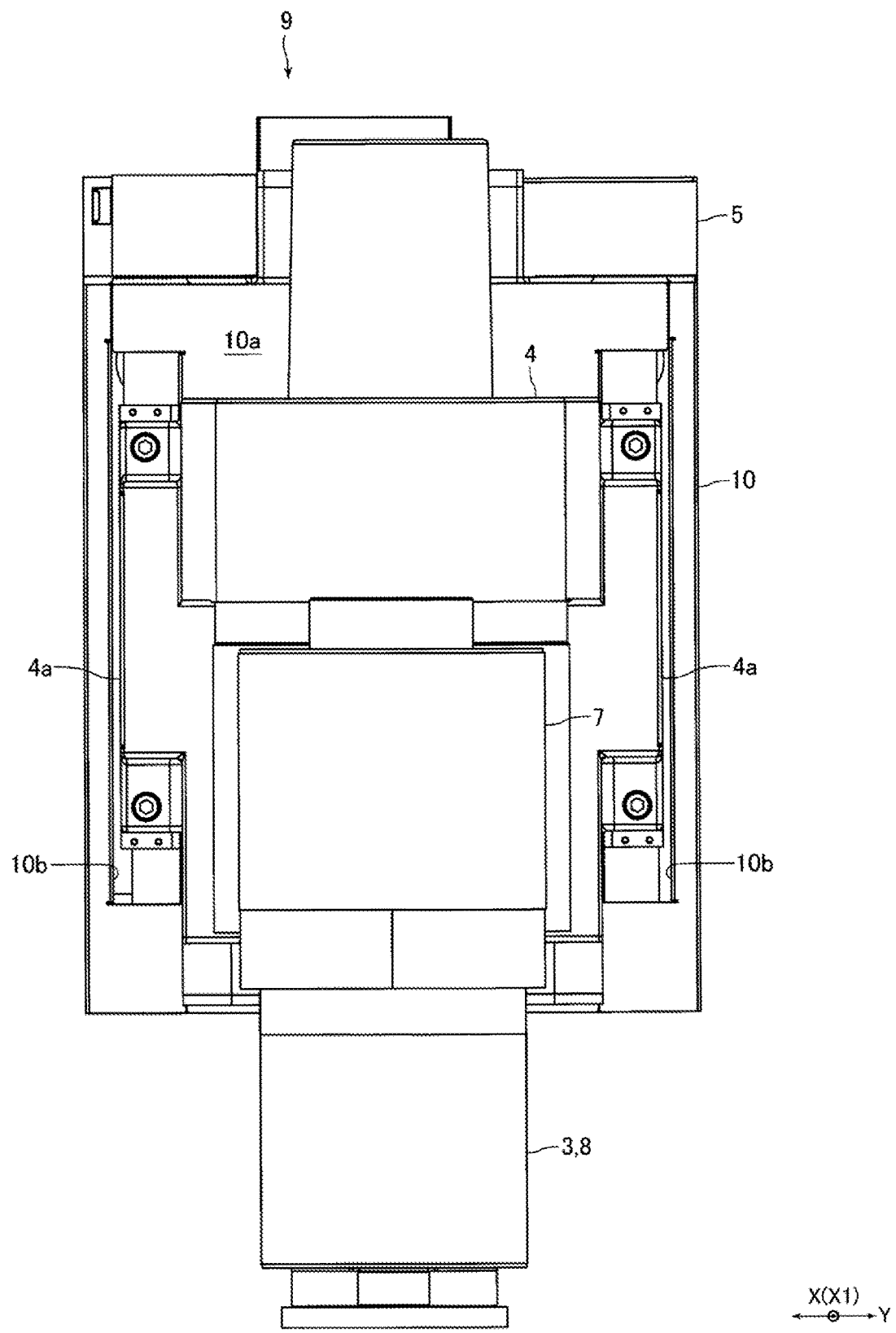
FIG. 3 is a front view showing a state that cover members are detached from the industrial robot shown in FIG. 2.
Figure 4:
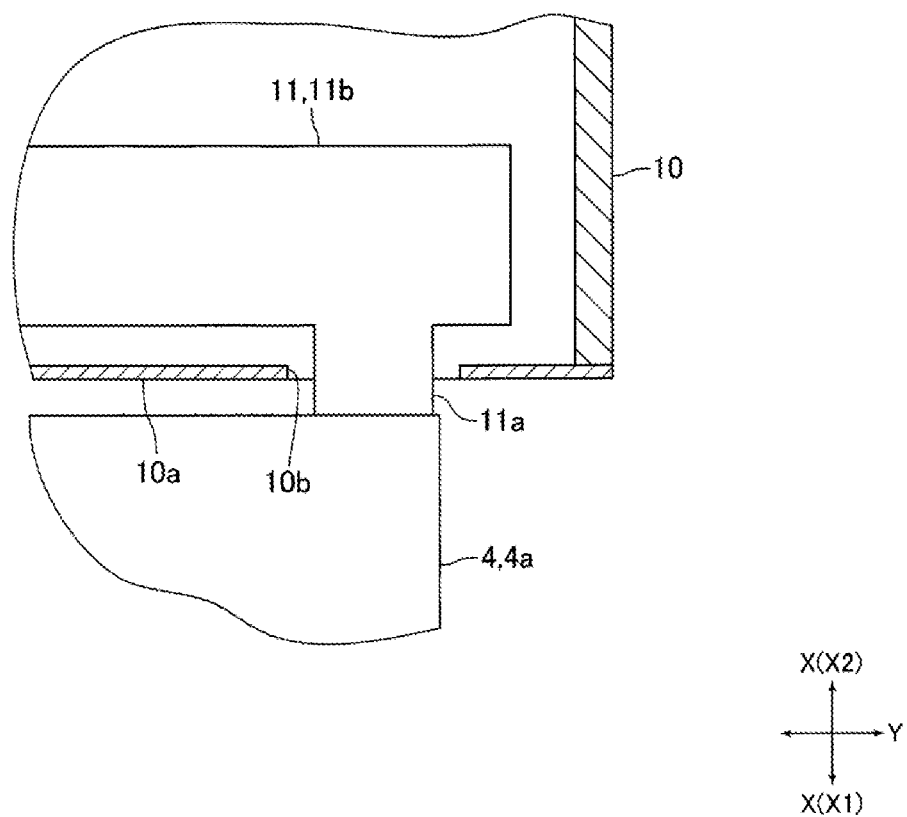
FIG. 4 is an explanatory schematic view showing a structure of a connecting part of an arm support member with a connection member shown in FIG. 1.

FIG. 1 is a perspective view showing an industrial robot 1 in accordance with an embodiment of the present invention. FIG. 2 is a front view showing the industrial robot 1 in FIG. 1. FIG. 3 is a front view showing a state that cover members 14 and 15 are detached from the industrial robot 1 shown in FIG. 2. FIG. 4 is an explanatory schematic view showing a structure of a connecting part of an arm support member 4 with a connection member 11 shown in FIG. 1.

An industrial robot 1 (hereinafter, referred to as a "robot 1") in this embodiment is a horizontal multi-joint type robot for transferring an object to be transferred such as a semiconductor wafer. The robot 1 transfers an object to be transferred under a clean environment in an inside of a clean room or the like. The robot 1 includes an arm 3, an arm support member 4 which supports the arm, and a main body part 5 which holds the arm support member 4 so that the arm support member 4 is capable of being lifted and lowered. In the following descriptions, the "X" direction in FIG. 1 and the like which is perpendicular to an upper and lower direction is referred to as a "front and rear direction", and the "Y" direction in FIG. 1 and the like which is perpendicular to the upper and lower direction and the front and rear direction is referred to as a "right and left direction". Further, the "X1" direction side in FIG. 1 and the like which is one side in the front and rear direction is referred to as a "front" side, and the "X2" direction side in FIG. 1 and the like which is the reverse direction is referred to as a "rear" side.

The arm 3 is structured of a first arm part 7 whose base end side is turnably connected with the arm support member 4 and a second arm part 8 whose base end side is turnably connected with a tip end side of the first arm part 7. In other words, the arm 3 is structured of two arm parts. The base end side of the first arm part 7 is turnably connected with a front end side of the arm support member 4. A tip end side of the second arm part 8 is turnably connected with a hand (not shown) on which an object to be transferred is mounted. In accordance with an embodiment of the present invention, the arm 3 may be structured of three or more arm parts.

The main body part 5 includes a lifting mechanism 9 for lifting and lowering the arm support member 4, a housing 10 which is disposed with the lifting mechanism 9 in its inside (in other words, the lifting mechanism 9 is accommodated in its inside), and a connection member 11 (see FIG. 4) which connects the arm support member 4 with the lifting mechanism 9. The arm support member 4 is arranged outside the housing 10. Further, the arm support member 4 is disposed on a front side of the housing 10. In other words, the arm support member 4 is disposed on a front side of the main body part 5. Both end parts in the right and left direction of the arm support member 4 are structured as fixed parts 4a which are fixed to the connection member 11. In this embodiment, a lifting and lowering quantity of the arm support member 4 is set to be comparatively small. For example, the lifting and lowering quantity of the arm support member 4 is set to be about 40 mm.

The housing 10 is provided with a front face part 10a which structures a front side face of the housing 10. The front face part 10a is formed in a thin flat plate shape, and a thickness direction of the front face part 10a is coincided with the front and rear direction. The front face part 10a is formed with an opening part 10b for connecting the arm support member 4 disposed outside the housing 10 with the lifting mechanism 9 disposed inside the housing 10. In other words, a side face (front side face) of the housing 10 is formed with the opening part 10b. The opening part 10b is formed in both end parts in the right and left direction of the front face part 10a. In other words, the front face part 10a is formed with two opening parts 10b. The opening part 10b penetrates through the front face part 10a in the front and rear direction. Further, the opening part 10b is formed in a rectangular shape which is long and thin in the upper and lower direction.

The connection member 11 includes a fixing part 11a to which the arm support member 4 is fixed and a lifting part 11b which is disposed inside the housing 10. The fixing part 11a is connected with the lifting part 11b and is integrated with the lifting part 11b. The fixing part 11a is protruded to a front side from both end parts in the right and left direction of the lifting part 11b. Further, the fixing part 11a is disposed in the opening part 10b so as to pass through the opening part 10b in the front and rear direction. A front end of the fixing part 11a is disposed on a front side with respect to the front face of the front face part 10a. The front end of the fixing part 11a is fixed to a rear face of the fixed part 4a of the arm support member 4. The connection member 11 is lifted and lowered together with the arm support member 4. The lifting part 11b in this embodiment is a lifting member which is lifted and lowered together with the arm support member 4 and is disposed inside the housing 10.

As described above, the opening part 10b is formed in a rectangular shape which is long and thin in the upper and lower direction. The opening part 10b is formed in a substantially entire area in a movable range of the fixing part 11a in the upper and lower direction so that the arm support member 4 is capable of moving in the upper and lower direction. An upper end of the opening part 10b is disposed on an upper side with respect to an upper end of the fixed part 4a and an upper end of the fixing part 11a when the arm support member 4 is located at a predetermined reference position. A lower end of the opening part 10b is disposed on a lower side with respect to a lower end of the fixed part 4a and a lower end of the fixing part 11a when the arm support member 4 is located at the reference position.

In accordance with an embodiment of the present invention, it may be structured that a part of the fixed part 4a of the arm support member 4 is disposed in the opening part 10b so as to pass through the opening part 10b in the front and rear direction. In this case, a rear end of the part of the fixed part 4a is disposed on a rear side with respect to a rear face of the front face part 10a, and the rear end of the part of the fixed part 4a is fixed to a front face of the lifting part 11b. Further, in this case, the connection member 11 is not provided with the fixing part 11a. Further, in this case, the opening part 10b is formed in a substantially entire area of a movable range in the upper and lower direction of the part of the fixed part 4a disposed in the opening part 10b so that the arm support member 4 is capable of moving in the upper and lower direction. In the present specification, also in this case, the arm support member 4 is regarded to be disposed outside the housing 10.

The lifting mechanism 9 includes a drive mechanism which lifts and lowers the arm support member 4 and a guide mechanism which guides the arm support member 4 in the upper and lower direction. The drive mechanism includes, for example, a ball screw and a motor for rotating a screw shaft of the ball screw. The screw shaft of the ball screw is disposed with the upper and lower direction as its axial direction and is turnably held by the housing 10. The guide mechanism includes, for example, a guide shaft disposed with the upper and lower direction as its axial direction and a guide bush which is engaged with the guide shaft. The guide shaft is fixed to the housing 10.

A nut member of the ball screw and the guide bush are fixed to the lifting part 11b. In accordance with an embodiment of the present invention, the drive mechanism may include a belt a part of which is fixed to the lifting part 11b, pulleys over which the belt is stretched, and a motor which rotates the pulleys. Alternatively, the guide mechanism may include a guide rail which is disposed with the upper and lower direction as its longitudinal direction, and a guide block which is fixed to the lifting part 11b and is engaged with the guide rail.

The arm support member 4 is fixed with cover members 14 and 15 in a flat plate shape for closing the opening part 10b. Specifically, the arm support member 4 is fixed with the cover member 14 for closing an upper side portion of the opening part 10b and the cover member 15 for closing a lower side portion of the opening part 10b. The cover members 14 and 15 are disposed outside the housing 10. The cover member 14 in this embodiment is a first cover member and the cover member 15 is a second cover member.

The cover members 14 and 15 are metal plates formed in a rectangular shape. In other words, the cover members 14 and 15 are sheet metals in a rectangular shape. The cover members 14 and 15 are fixed to the arm support member 4 so that thickness directions of the cover members 14 and 15 are coincided with the front and rear direction. Further, each of the cover members 14 and 15 is fixed to the arm support member 4 by a screw. The cover members 14 and 15 are lifted and lowered together with the arm support member 4 and the connection member 11.

The cover member 14 is fixed to an upper end part of the fixed part 4a on both sides in the right and left direction of the arm support member 4. The cover member 14 is extended toward an upper side from the upper end part of the fixed part 4a, and the upper end of the cover member 14 is disposed on an upper side with respect to the upper end of the fixed part 4a. The cover member 14 covers an upper side portion of the opening part 10b with respect to the fixed part 4a and the fixing part 11a from the front side to close the upper side portion of the opening part 10b with respect to the fixed part 4a and the fixing part 11a. The upper end of the cover member 14 is located on a lower side with respect to an upper end of the main body part 5 when the arm support member 4 is moved to an upper limit position with respect to the housing 10 (see two-dot chain line in FIG. 2). In other words, when viewed in the front and rear direction, even when the arm support member 4 is moved to the upper limit position with respect to the housing 10, the cover member 14 is set within a range of an outer shape of the main body part 5.

The cover member 15 is fixed to a lower end part of the fixed part 4a on both sides in the right and left direction of the arm support member 4. The cover member 15 is extended toward a lower side from the lower end part of the fixed part 4a, and the lower end of the cover member 15 is disposed on a lower side with respect to the lower end of the fixed part 4a. The cover member 15 covers a lower side portion of the opening part 10b with respect to the fixed part 4a and the fixing part 11a from the front side to close the lower side portion of the opening part 10b with respect to the fixed part 4a and the fixing part 11a. The lower end of the cover member 15 is located on an upper side with respect to a lower end of the main body part 5 when the arm support member 4 is moved to a lower limit position with respect to the housing 10 (see two-dot chain line in FIG. 2). In other words, when viewed in the front and rear direction, even when the arm support member 4 is moved to the lower limit position with respect to the housing 10, the cover member 15 is set within a range of the outer shape of the main body part 5.

(Principal Effects in this Embodiment)

As described above, in this embodiment, the cover members 14 and 15 in a flat plate shape for closing the opening part 10b formed in a side face of the housing 10 are fixed to the arm support member 4. Therefore, according to this embodiment, the opening part 10b of the housing 10 is closed by using inexpensive cover members 14 and 15 in a flat plate shape and thereby, dust generated from the lifting mechanism 9 and the like in the inside of the housing 10 is capable of being prevented from flowing out from the opening part 10b to the outside of the housing 10. Accordingly, in this embodiment, even when the dust generated inside the housing 10 is capable of being prevented from flowing out from the opening part 10b to the outside of the housing 10, a cost of the robot 1 can be reduced.

In this embodiment, the cover members 14 and 15 are disposed outside the housing 10. Therefore, according to this embodiment, arrangement spaces of the cover members 14 and 15 are not required to provide in an inside of the housing 10. Accordingly, in this embodiment, a degree of freedom of arrangement of various parts disposed in the inside of the housing 10 can be enhanced and, in addition, a size of the housing 10 can be reduced.

In this embodiment, when viewed in the front and rear direction, even when the arm support member 4 is moved to an upper limit position with respect to the housing 10, the cover member 14 is set within a range of the outer shape of the main body part 5. Further, in this embodiment, when viewed in the front and rear direction, even when the arm support member 4 is moved to a lower limit position with respect to the housing 10, the cover member 15 is set within the range of the outer shape of the main body part 5. Therefore, according to this embodiment, even when the cover members 14 and 15 which are lifted and lowered together with the arm support member 4 are fixed to the arm support member 4, a size of the robot 1 can be prevented from increasing in the upper and lower direction.

(Other Embodiments)

Although the present invention has been shown and described with reference to a specific embodiment, various changes and modifications will be apparent to those skilled in the art from the teachings herein.

In the embodiment described above, it may be structured that the cover members 14 and 15 are fixed to the lifting part 11b of the connection member 11 and are disposed inside the housing 10. Further, it may be structured that one of the cover member 14 and the cover member 15 is fixed to the fixed part 4a of the arm support member 4 and is disposed outside the housing 10, and that the other of the cover member 14 and the cover member 15 is fixed to the lifting part 11b and is disposed inside the housing 10. Also in these cases, the opening part 10b of the housing 10 is capable of being closed by the inexpensive flat plate-shaped cover members 14 and 15 and thus, dust generated from the lifting mechanism 9 and the like inside the housing 10 can be prevented from flowing out from opening part 10b to the outside of the housing 10.

In the embodiment described above, it may be structured that, when the arm support member 4 is moved to an upper limit position with respect to the housing 10, the upper end of the cover member 14 is protruded to an upper side with respect to the upper end of the main body part 5. Further, in the embodiment described above, it may be structured that, when the arm support member 4 is moved to a lower limit position with respect to the housing 10, the lower end of the cover member 15 is protruded to a lower side with respect to the lower end of the main body part 5.

In the embodiment described above, it may be structured that, when the opening part 10b can be closed by the cover members 14 and 15, the cover members 14 and 15 may be formed in a quadrangular shape except a rectangular shape or may be formed in a multi-angular shape other than a quadrangular shape. Further, the cover members 14 and 15 may be formed of material such as resin other than metal. Further, an industrial robot to which the structure in the present invention is applied may be a robot other than a horizontal multi-joint type robot.

The invention claimed is:

1. An industrial robot having a right and left direction, comprising:
    an arm;
    an arm support member which supports the arm; and
    a main body part which holds the arm support member so as to be capable of lifting and lowering the arm support member;
    wherein the main body part comprises:
        a lifting mechanism for lifting and lowering the arm support member;
        a housing inside in which the lifting mechanism is disposed; and
        a connection member, disposed in the housing and configured to connect the arm support member with the lifting mechanism,
    wherein the arm support member is disposed outside the housing;
    wherein the housing includes a front face part which is at a front side face of the housing and faces the arm support member,
    and the front face part of the housing includes two opening parts for the connection member to extend from inside of the housing to outside of the housing, wherein the connection member connects the arm support member disposed outside the housing with the lifting mechanism disposed inside the housing,
    wherein one opening part is formed at a left side of the front face part in the right and left direction of the housing, and another opening part is formed at a right side of the front face part in the right and left direction of the housing;
    wherein the arm support member is provided with two first cover members and two second cover members in a flat plate shape lifted and lowered together with the arm support member for partially closing the two opening parts,
    the arm support member is provided with the two first cover members for partially covering upper side portions of the two opening parts, and
    the arm support member is provided with the two second cover members for partially covering lower side portions of the two opening parts.

2. The industrial robot according to claim 1, wherein the two first cover members and the two second cover members are provided to the arm support member and are disposed outside the housing.

3. The industrial robot according to claim 2, wherein the industrial robot has a lower side and an upper side, the arm support member is provided with the two first cover members and the two second cover members, wherein the two first cover members are for partially covering the upper side portions of the two opening parts, and the two second cover members are for partially covering a the lower side portions of the two opening parts,
    an upper end of each of the first cover members is disposed on the lower side of the industrial robot with respect to an upper end of the main body part when the arm support member is moved to an upper limit position with respect to the housing, and
    a lower end of each of the second cover members is disposed on the upper side of the industrial robot with respect to a lower end of the main body part when the arm support member is moved to a lower limit position with respect to the housing.

4. The industrial robot according to claim 1, wherein the two first cover members and the two second cover members are configured to partially close the opening parts, even when the arm support member is lifted and lowered.

5. An industrial robot having a right and left direction, comprising:
    an arm;
    an arm support member which supports the arm; and
    a main body part which holds the arm support member so as to be capable of lifting and lowering the arm support member;
    wherein the main body part comprises:

a lifting mechanism for lifting and lowering the arm support member;

a housing in which the lifting mechanism is disposed; and a connection member, disposed in the housing and configured to connect the arm support member with the lifting mechanism, wherein the arm support member is disposed outside the housing;

wherein the housing includes a front face part which is at a front side face of the housing and faces the arm support member, and the front face part of the housing includes two opening parts for the connection member to extend from inside of the housing to outside of the housing, wherein the connection member connects the arm support member disposed outside the housing with the lifting mechanism disposed inside the housing, wherein one opening part is formed at left side of the front face part in the right and left direction of the housing, and another opening part is formed at right side of the front face part in the right and left direction of the housing;

wherein the connection member includes a lifting member, which is lifted and lowered together with the arm support member and is disposed inside the housing, is provided with two first cover members and two second cover members in the flat plate shape lifted and lowered together with the arm support member for partially covering the two opening parts, the lifting member of the connection member is provided with the two first cover members for partially covering upper side portions of the two opening parts, and the lifting member of the connection member is provided with the two second cover members for partially covering lower side portions of the two opening parts.

6. The industrial robot according to claim 1, wherein a lower end of each of the first cover members is fixed to the arm support member, and an upper end of each of the first cover members is not fixed to the arm support member, an upper end of each of the second cover members is fixed to the arm support member, and a lower end of each of the second cover members is not fixed to the arm support member.

7. The industrial robot according to claim 6, wherein a lower end of each of the first cover members is fixed to the lifting member, and an upper end of each of the first cover members is not fixed to the lifting member, an upper end of each of the second cover members is fixed to the lifting member, and a lower end of each of the second cover members is not fixed to the lifting member.

* * * * *